(12) United States Patent
Otremba et al.

(10) Patent No.: US 9,099,391 B2
(45) Date of Patent: Aug. 4, 2015

(54) SEMICONDUCTOR PACKAGE WITH TOP-SIDE INSULATION LAYER

(71) Applicant: Infineon Technologies Austria AG, Villach (AT)

(72) Inventors: Ralf Otremba, Kaufbeuren (DE); Jürgen Schredl, Mering (DE); Wolfgang Peinhopf, Viktring (AT); Fabio Brucchi, Villach (AT); Josef Höglauer, Heimstetten (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 13/803,255

(22) Filed: Mar. 14, 2013

(65) Prior Publication Data

US 2014/0264944 A1 Sep. 18, 2014

(51) Int. Cl.
*H01L 23/28* (2006.01)
*H01L 23/48* (2006.01)
*H01L 23/00* (2006.01)
*H01L 23/36* (2006.01)
*H01L 23/40* (2006.01)
*H01L 23/495* (2006.01)
*H01L 23/31* (2006.01)

(52) U.S. Cl.
CPC ............ *H01L 23/28* (2013.01); *H01L 23/3135* (2013.01); *H01L 23/36* (2013.01); *H01L 23/4093* (2013.01); *H01L 23/48* (2013.01); *H01L 23/49562* (2013.01); *H01L 24/80* (2013.01); *H01L 23/3107* (2013.01); *H01L 2224/2919* (2013.01); *H01L 2224/32245* (2013.01); *H01L 2224/48247* (2013.01); *H01L 2224/73265* (2013.01); *H01L 2924/1305* (2013.01); *H01L 2924/1306* (2013.01); *H01L 2924/13055* (2013.01); *H01L 2924/13091* (2013.01); *H01L 2924/1815* (2013.01)

(58) Field of Classification Search
CPC .......... H01L 23/28; H01L 23/48; H01L 24/80
USPC ................... 257/676, 787, E23.06, E23.066, 257/E23.124, E23.193, E23.194
See application file for complete search history.

(56) References Cited

U.S. PATENT DOCUMENTS

| | | | | | |
|---|---|---|---|---|---|
| 4,717,948 A | * | 1/1988 | Sakai et al. | ................... | 257/786 |
| 4,723,156 A | * | 2/1988 | Okuaki | ......................... | 257/681 |
| 4,974,057 A | * | 11/1990 | Tazima | ......................... | 257/693 |
| 4,975,762 A | * | 12/1990 | Stradley et al. | ............... | 257/660 |
| 5,463,248 A | * | 10/1995 | Yano et al. | .................... | 257/677 |
| 5,581,119 A | * | 12/1996 | Liou | ............................. | 257/676 |
| 5,814,882 A | * | 9/1998 | Shimada et al. | ............. | 257/704 |
| 5,889,232 A | * | 3/1999 | Ichikawa et al. | ............. | 174/524 |
| 5,937,124 A | * | 8/1999 | Roff | ................................ | 385/88 |

(Continued)

*Primary Examiner* — Ida M Soward
(74) *Attorney, Agent, or Firm* — Murphy, Bilak & Homiller, PLLC

(57) ABSTRACT

A semiconductor package includes a base, a die attached to the base, a lead and a connector electrically connecting the lead to the die. A mold compound encapsulates the die, the connector, at least part of the base, and part of the lead, so that the lead extends outward from the mold compound. An electrical insulation layer separate from the mold compound is attached to a surface of the mold compound over the connector. The electrical insulation layer has a fixed, defined thickness so that the package has a guaranteed minimum spacing between an apex of the connector and a surface of the electrical insulation layer facing away from the connector.

7 Claims, 4 Drawing Sheets

(56) References Cited

U.S. PATENT DOCUMENTS

| | | | |
|---|---|---|---|
| 5,939,792 A * | 8/1999 | Ishikawa | 257/790 |
| 6,756,670 B1 * | 6/2004 | Yamazaki et al. | 257/729 |
| 6,925,875 B2 * | 8/2005 | Silverbrook | 73/493 |
| 7,193,009 B2 * | 3/2007 | Amou et al. | 524/575 |
| 7,629,676 B2 * | 12/2009 | Otremba et al. | 257/676 |
| 7,948,001 B2 * | 5/2011 | Kamada et al. | 257/99 |
| 8,742,559 B2 * | 6/2014 | Takahashi | 257/678 |
| 2004/0202212 A1 * | 10/2004 | Yamauchi | 372/36 |
| 2007/0144272 A1 * | 6/2007 | Yu et al. | 73/862.046 |
| 2008/0246130 A1 * | 10/2008 | Carney et al. | 257/675 |
| 2012/0119234 A1 * | 5/2012 | Shioi et al. | 257/88 |
| 2013/0175704 A1 * | 7/2013 | Jeun et al. | 257/777 |
| 2013/0208442 A1 * | 8/2013 | Reiherzer | 362/84 |

* cited by examiner

SEMICONDUCTOR PACKAGE WITH TOP-SIDE INSULATION LAYER

TECHNICAL FIELD

The present application relates to semiconductor packages, in particular packages used for high power applications.

BACKGROUND

Discrete power semiconductors such as MOSFETs (metal-oxide semiconductor field-effect transistors) are operated at high voltages and can generate significant losses in the form of heat. As a result, packages housing power semiconductors require cooling and must comply with industry safety and isolation specifications, such as those required by UL Standards pertaining to semiconductor packages. To ensure normal operation, meet safety, and isolation requirements, sufficient cooling should be provided through means such as a heat sink, and packages should meet minimum creepage distance, clearance distance, and isolation distance requirements between high voltages that can occur at the package leads and the low voltage or ground potential provided at the heat sink, package mounting mechanism, and/or structure that the package is mounted to.

SUMMARY

According to an embodiment of a semiconductor package, the package comprises a base, a die attached to the base, a lead, a connector electrically connecting the lead to the die, a mold compound that encapsulates the die, the connector, at least part of the base, and part of the lead, so that the lead extends outward from the mold compound. The semiconductor package further comprises an electrical insulation layer separate from the mold compound and attached to a surface of the mold compound over the connector. The electrical insulation layer has a fixed, defined thickness so that the package has a guaranteed minimum spacing between an apex of the connector and a surface of the electrical insulation layer facing away from the connector.

According to an embodiment of a semiconductor device assembly, the assembly comprises a substrate and a semiconductor package. The package includes a base, a die attached to the base, a lead, a connector electrically connecting the lead to the die, a mold compound that encapsulates the die, the connector, at least part of the base, and part of the lead so that the lead extends outward from the mold compound. The package includes an electrical insulation layer separate from the mold compound and attached to a surface of the mold compound over the connector. The semiconductor device assembly further comprises a clip which presses against the electrical insulation layer to force the package against the substrate when the clip is engaged with the substrate. The electrical insulation layer has a fixed, defined thickness so that the semiconductor device assembly has a guaranteed minimum spacing between an apex of the connector and where the clip presses against the electrical insulation layer.

According to an embodiment of a method of manufacturing a semiconductor package, the method comprises: providing a semiconductor package including a base, a die attached to the base, a lead, a connector electrically connecting the lead to the die, a mold compound encapsulating the die, the connector, at least part of the base, and part of the lead so that the lead extends outward from the mold compound; and attaching an electrical insulation layer to a surface of the mold compound over the connector, the electrical insulation layer having a fixed, defined thickness so that the package has a guaranteed minimum spacing between an apex of the connector and a surface of the electrical insulation layer facing away from the connector.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined, unless they exclude each other. Embodiments are depicted in the drawings and are detailed in the description which follows.

DETAILED DESCRIPTION

Figure 1:
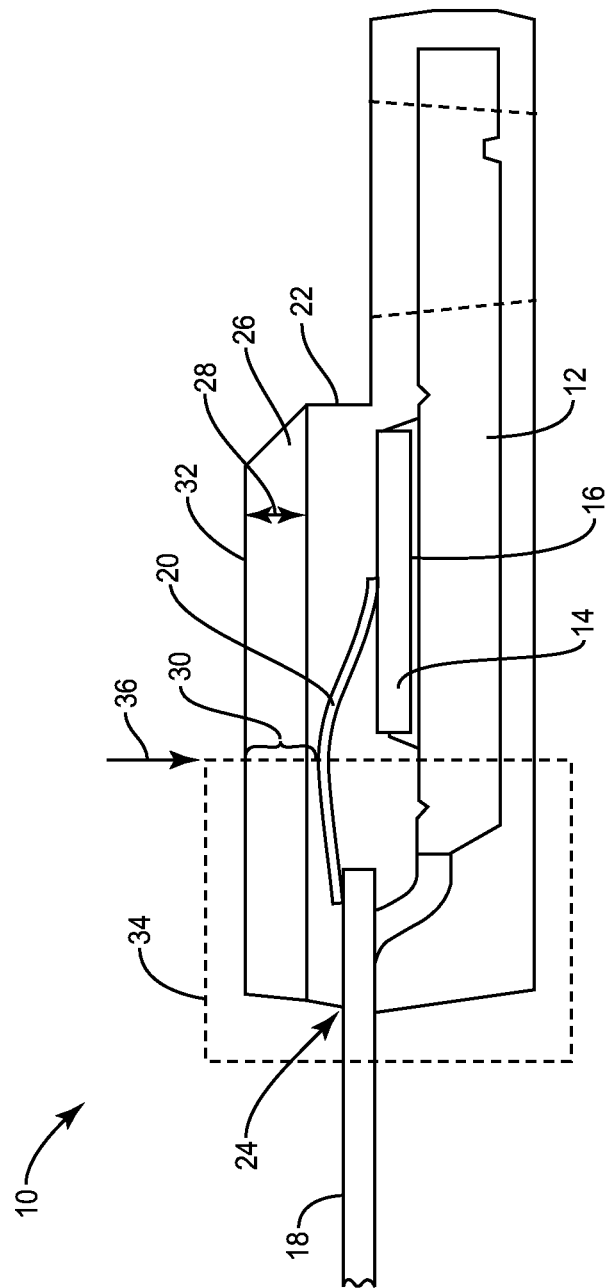
FIG. 1 illustrates a sectional side view of a semiconductor package.
Figure 2:
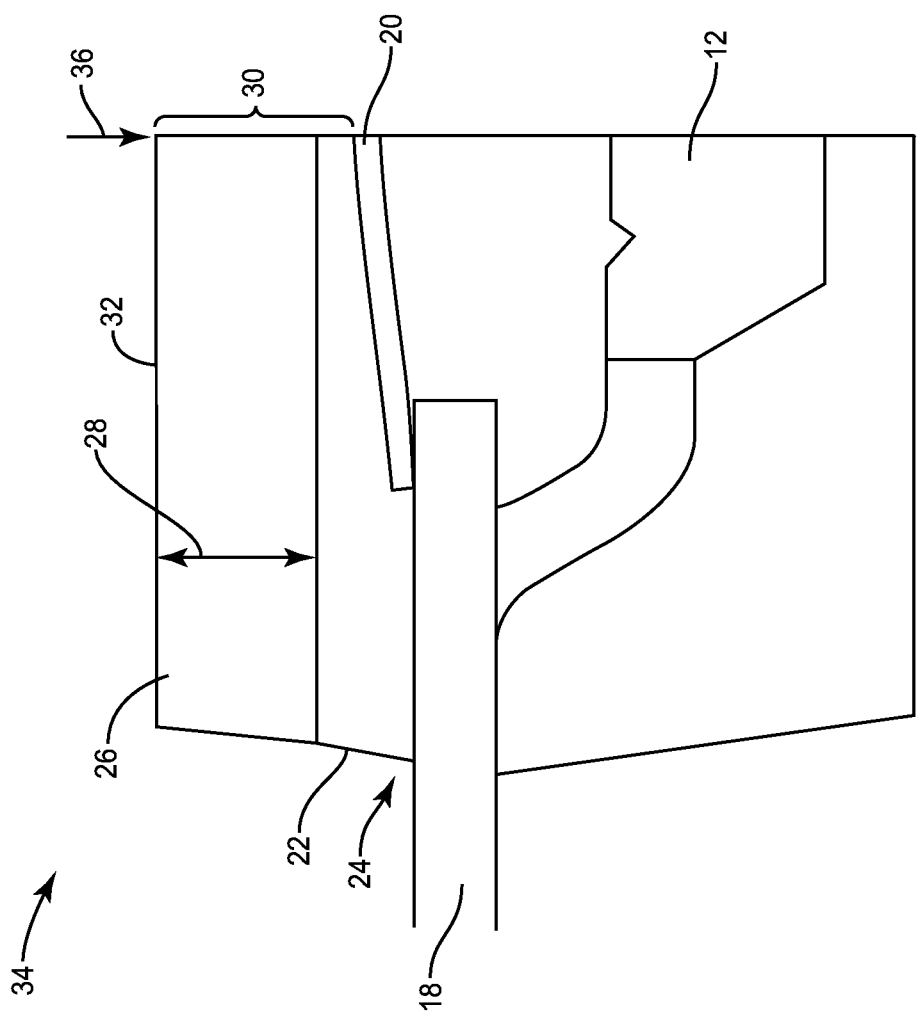
FIG. 2 illustrates an enlarged sectional side view of part of the semiconductor package of FIG. 1.

Referring to FIG. 1 and FIG. 2, FIG. 1 illustrates a sectional side view of an embodiment of a semiconductor package 10, and FIG. 2 illustrates an enlarged sectional side view of part of package 10 illustrated in FIG. 1. The partial view of package 10 illustrated in FIG. 2 is represented by the dashed outline labeled as 34 in FIG. 1.

Figure 3:
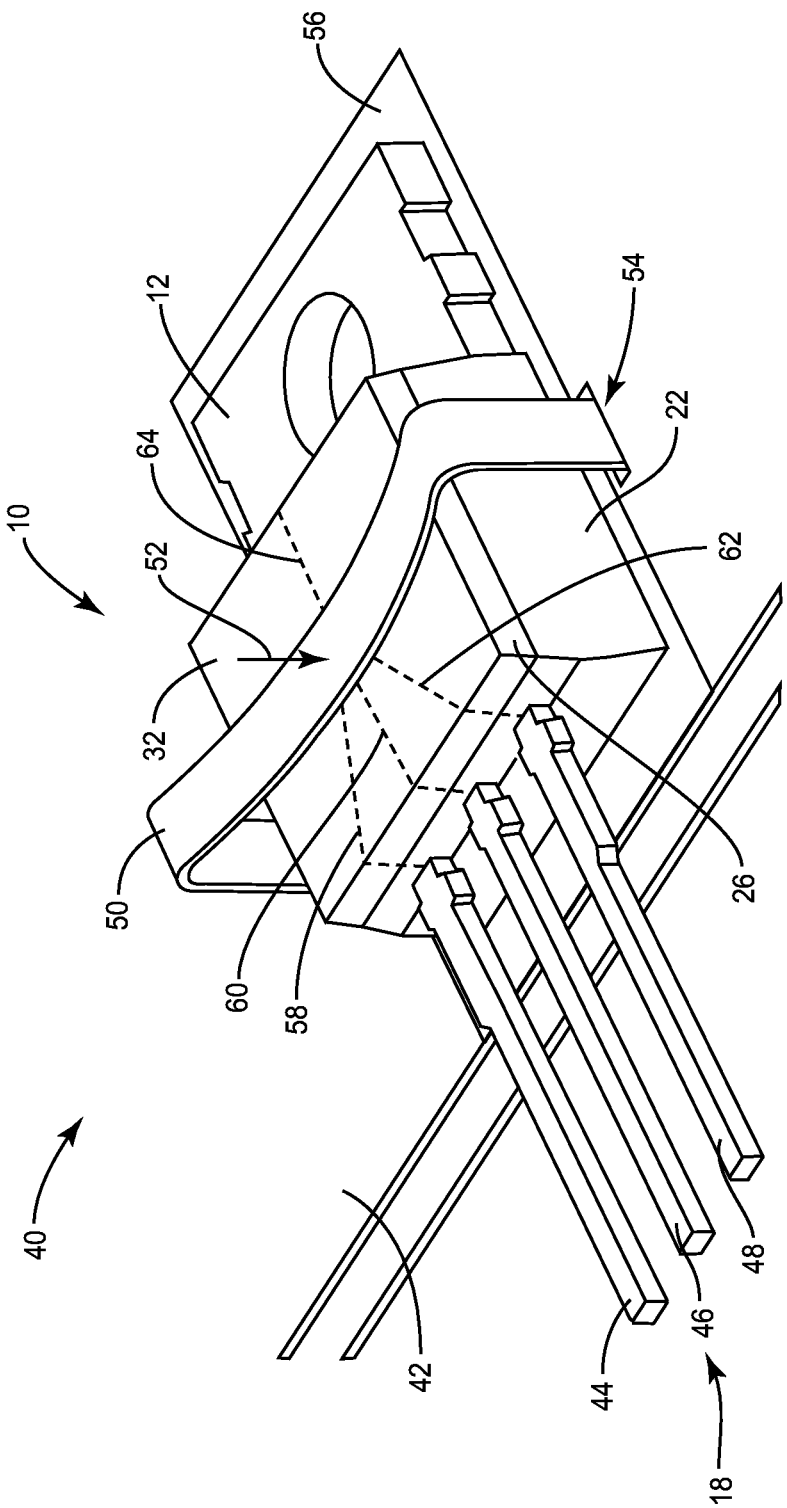
FIG. 3 illustrates a perspective view of a semiconductor device assembly.

In the illustrated embodiment, package 10 is a TO-220 type of package. In other embodiments, package 10 can be other suitable types of through hole or surface mount packages that include, but are not limited to, Transistor Outline (TO) packages, Dual-In-Line Packages (DIP), Small Outline Packages (SO/SOP) and Small Outline Transistor (SOT) packages. In the illustrated embodiment, package 10 includes a base 12 and a die 14. In one embodiment, die 14 is a metal-oxide semiconductor field-effect transistor (MOSFET). In another embodiment, die 14 is an insulated gate bipolar transistor (IGBT). In yet other embodiments, die 14 can be other suitable types of power devices, e.g. such as a diode. Die 14 is attached to base 12 using a suitable conductive adhesive 16, such as solder or glue. Die 14 is electrically coupled to lead 18 of package 10 via electrical connector 20 such as a bond wire, ribbon, etc. A mold compound 22 encapsulates die 14, connector 20, at least part of base 12, and a part of lead 18, as indicated at 24, inside of mold compound 22. Although base 12 is shown in FIG. 1 as being fully encapsulated by mold compound 22, FIG. 3 illustrates an embodiment of package 10 wherein base 12 is only partially encapsulated by mold compound 22. In one embodiment, mold compound 22 is an epoxy resin material. In other embodiments, mold compound 22 can be other suitable types of materials.

Referring to FIG. 1 and FIG. 2, package 10 includes an electrical insulation layer 26 attached to mold compound 22 and overlying connector 20. Insulation layer 26 is separate (i.e., distinct or unique) from mold compound 22, and may be of the same or different material. Any material suitable for providing the desired electrical isolation can be used for insulation layer 26. Insulation layer 26 has a fixed, defined (known) thickness 28 so that package 10 has a guaranteed minimum spacing 30 between connector 20 and a surface 32 of insulation layer 26 that is facing away from connector 20.

The guaranteed minimum spacing 30 is defined to be between surface 32 and the portion of conductor 20 closest to surface 32, i.e. the apex of conductor 20, as indicated at 36. In other embodiments, there are two or more conductors 20, and the guaranteed minimum spacing 30 is defined with respect to conductor 20, with an apex closest to surface 32 of insulation layer 26.

FIG. 3 illustrates a perspective view of a semiconductor device assembly 40. Semiconductor device assembly 40 includes a package 10, a clip 50, and a substrate 42. Embodiments of semiconductor package 10 are illustrated in FIG. 1 and FIG. 2. Referring to FIG. 3, clip 50 presses against surface 32 of insulation layer 26 to force package 10 against substrate 42 when clip 50 is engaged with substrate 42, as illustrated at 54. Insulation layer 26 has a fixed, defined (known) thickness 28, as previously described herein, so that semiconductor device assembly 40 has a guaranteed minimum spacing 30 between connector 20 and where clip 50 presses against surface 32 of insulation layer 26 (refer also to FIGS. 1-2).

In one embodiment, an isolation layer 56 is placed between package 10 and substrate 42. In one embodiment, substrate 42 is a heatsink used to draw heat away from package 10, and isolation layer 56 is made from a thermally conductive material.

Referring to FIGS. 1-3, in order to meet industry clearance, creepage, and isolation distance requirements for electrical isolation, the material used for insulation layer 26 depends, in part, upon the voltages that are applied to package 10. Clearance distance is defined as the shortest distance between two conductive materials measured through air. Creepage distance is defined as the shortest path between two conductive materials measured along the surface of an isolator which is between the two conductive materials. Isolation distance is defined as the shortest distance between two conductive materials measured through an insulator. For package 10, the distance requirement that must be met is illustrated at 30 when clip 50 engages substrate 42 at 54 and contacts surface 32 of insulation layer 26 at 52. This is the minimum distance of spacing between the apex of conductive lead 20 and clip 50. Conductive clip 50 presses against insulation layer 26 at surface 32, such that the two conductive materials used to specify the distance illustrated at 30 are conductive clip 50 and connector 20. Insulation layer 26 lies between connector 20, and conductive clip 50 and has a fixed, defined (known) thickness 28 that provides a guaranteed minimum spacing 30 between connector 20 and clip 50. The fixed, defined (known) thickness 28 of insulation layer 26 can be used to satisfy isolation distance requirements. The creepage distances for package 10 are illustrated at 58, 60, 62 and 64. Creepage distances 58, 60 and 62 are defined respectively to be between leads 44, 46 and 48 and the portion of clip 50 that contacts surface 32 at 52. Any of these leads 44, 46, 48 can correspond to lead 18 shown in FIGS. 1 and 2. Creepage distance 64 is defined to be between the portion of clip 50 that contacts surface 32 at 52 and base 12. Increasing the thickness 28 of insulation layer 26 results in a beneficial increase in the creepage distances illustrated at 58, 60, 62 and 64, each of which are partly a function of thickness 28 of insulation layer 26.

Referring to FIGS. 1-3, the Comparative Tracking Index (CTI) is one industry standard measurement used to measure the electrical breakdown (e.g., tracking) properties of an insulating material, and the results of testing a nominal 3 mm thickness of material is considered representative of the material's performance in any thickness. For example, if voltages in the range of 400 volts to 600 volts are applied to package 10, the CTI specifies materials in a "Material Group II" that will meet isolation distance requirements. According to one industry standard, a nominal thickness of 4 mm for a material such as insulation layer 26 satisfies the isolation distance requirements for use of a material specified by the CTI, for example, for a voltage range of 400 volts to 600 volts. In some embodiments, the material used for insulation layer 26 comprises at least one of AlN, Al2O3, BeO, BN, Si3N4 and SiO2. In other embodiments, the material used for insulation layer 26 comprises at least one of muscovite mica and phlogopite mica. In yet other embodiments, the material used for insulation layer 26 comprises either a silicon based fiber glass reinforced material or a silicon based polyimide reinforced material. In one embodiment, the minimum defined thickness of insulation layer 26 is 0.4 mm.

Referring to FIGS. 1-3, standards are used in the semiconductor industry to specify the overall dimensions of packages such as package 10. In the embodiments illustrated in FIGS. 1-3, package 10, including insulation layer 26, has dimensions that adhere to an industry package standard. In one embodiment, the industry package standard is a standard specified by JEDEC.

Figure 4A:
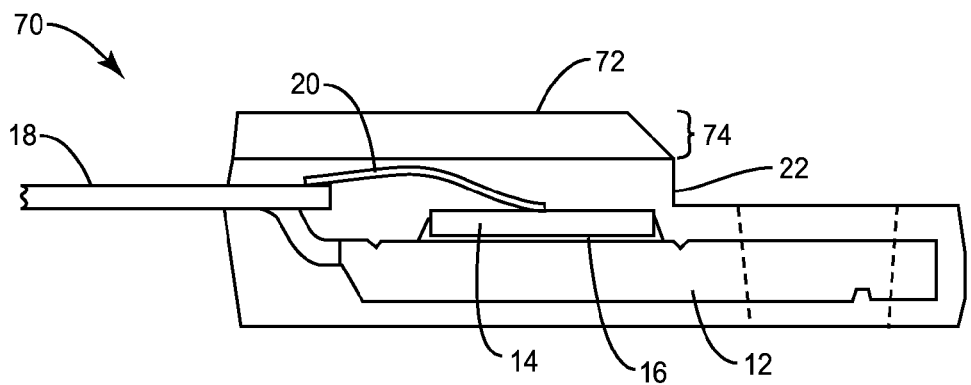
FIGS. 4A-4C illustrate a method of manufacturing a semiconductor package.
Figure 4B:
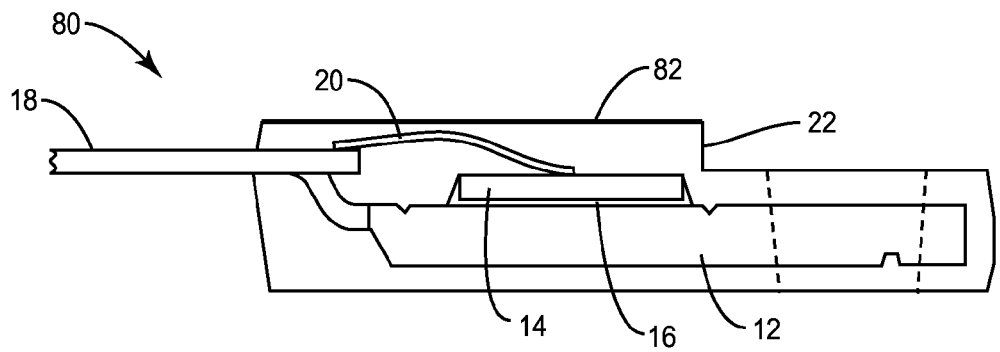
Figure 4C:
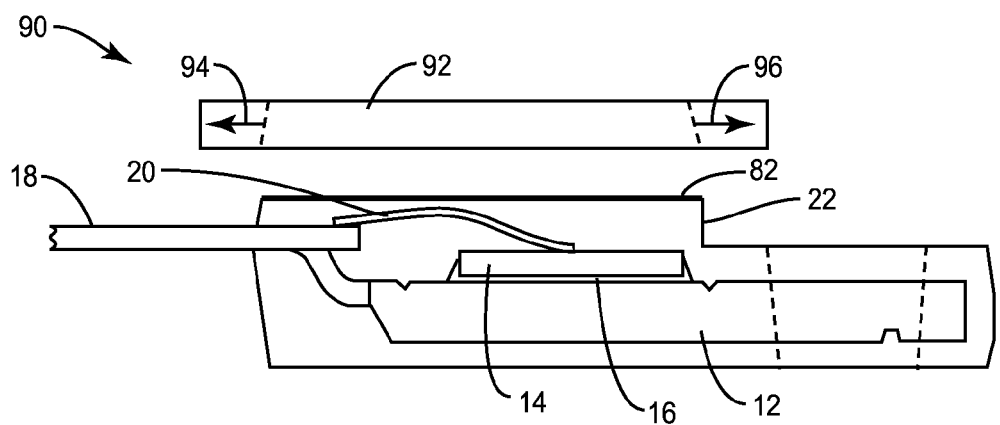

FIGS. 4A-4C illustrate a method of manufacturing a semiconductor package 10. Referring to FIG. 4A, the method of manufacturing package 10 is illustrated at 70 and begins by attaching a die 14 to base 12 using a suitable conductive adhesive 16, such as solder or glue. Next, die 14 is electrically connected to lead 18 via connector 20. A mold compound 22 is then used to encapsulate die 14, connector 20, at least part of base 12, and part of lead 18, so that lead 18 extends outward from mold compound 22. Mold compound 22 has a top surface 72 which overlies connector 20. In one embodiment, mold compound 22 is an epoxy resin material. In other embodiments, mold compound 22 can be other suitable types of encapsulating materials. Next, a portion 74 of mold compound 22 is removed over connector 20. The result is shown in FIG. 4B which illustrates at 80 a package that has portion 74 of mold compound 22 removed, so that mold compound 22 has a new top surface 82 closer to the apex of connector 20 than its starting top surface 72.

Referring to FIG. 4C, the method of manufacturing package 10 is illustrated at 90, and includes attaching an electrical insulation layer 92 to new top surface 82 of thinned mold compound 22 over connector 20. In some embodiments, material is removed from the periphery or at least ends of electrical insulation layer 92, as indicated at 94 and 96, before or after attaching insulation layer 92 to new top surface 82 of mold compound 22. In other embodiments, mold compound 22 is not thinned prior to attachment of insulation layer 92. Instead, insulation layer 92 is attached directly to original (non-thinned) surface 72 of mold compound 22. In either case, package 10, including insulation layer 92, has dimensions that adhere to an industry package standard, as previously described herein.

FIG. 1 illustrates a final result of the method of manufacturing package 10. Insulation layer 92 corresponds to insulation layer 26 in FIG. 1. Insulation layer 26 has a fixed, defined (known) thickness 28 so that package 10 has a guaranteed minimum spacing 30 between connector 20 and surface 32 of electrical insulation layer 26 facing away from connector 20.

Terms such as "same", "match" and "matches" as used herein are intended to mean identical, nearly identical, or approximately so that some reasonable amount of variation is contemplated without departing from the spirit of the invention. The term "constant" means not changing or varying, or changing or varying slightly so that some reasonable amount of variation is contemplated without departing from the spirit of the invention. Further, terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor package, comprising:
   a base;
   a die attached to the base;
   a lead;
   a connector electrically connecting the lead to the die;
   a mold compound encapsulating the die, the connector, at least part of the base, and part of the lead so that the lead extends outward from the mold compound; and
   an electrical insulation layer separate from the mold compound and comprising a different material than the mold compound, the electrical insulation layer being attached to a single side of the mold compound over the connector, the electrical insulation layer having a fixed, defined thickness so that the package has a guaranteed minimum spacing between an apex of the connector and a surface of the electrical insulation layer facing away from the connector.

2. The semiconductor package according to claim 1, wherein the material of the electrical insulation layer comprises at least one of AlN, Al2O3, BeO, BN, Si3N4 and SiO2.

3. The semiconductor package according to claim 1, wherein the material of the electrical insulation layer comprises at least one of muscovite mica and phlogopite mica.

4. The semiconductor package according to claim 1, wherein the material of the electrical insulation layer comprises either a silicon based fiber glass reinforced material or a silicon based polyimide reinforced material.

5. The semiconductor package according to claim 1, wherein the minimum thickness of the electrical insulation layer is 0.4 mm.

6. The semiconductor package according to claim 1, wherein the package including the electrical insulation layer has dimensions that adhere to an industry package standard.

7. The semiconductor package according to claim 6, wherein the industry package standard is a JEDEC standard.

* * * * *